United States Patent [19]
Van Zanten et al.

[11] Patent Number: 4,727,560
[45] Date of Patent: Feb. 23, 1988

[54] CHARGE-COUPLED DEVICE WITH REDUCED SIGNAL DISTORTION

[75] Inventors: Adrianus T. Van Zanten; Hendrikus J. M. Veendrick; Leonardus C. M. G. Pfennings, all of Eindhoven, Netherlands

[73] Assignee: U.S. Philips Corporation, New York, N.Y.

[21] Appl. No.: 855,652

[22] Filed: Apr. 25, 1986

[30] Foreign Application Priority Data

May 30, 1985 [NL] Netherlands .......................... 8501542

[51] Int. Cl.[4] .......................... G11C 19/28; H01L 29/78
[52] U.S. Cl. .......................................... 377/60; 357/24
[58] Field of Search ....................... 357/24; 377/57–63

[56] References Cited

U.S. PATENT DOCUMENTS 4,191,896 3/1980 Sauer et al. ........................... 377/60
4,627,082 12/1986 Pelgrom et al. ...................... 357/24

Primary Examiner—Gene M. Munson
Attorney, Agent, or Firm—Thomas A. Briody; William J. Streeter; Gregory P. Gadson

[57] ABSTRACT

The invention relates to a CCD input and reference charge generator, in which the occurrence of electron injection into the substrate (due to cross-talk to the substrate) and hence undesired signal distortions is prevented. For this purpose, the generator is provided with a voltage divider (26) which is constituted at least for a part (28) by a resistance element arranged outside the substrate, for example, by a polycrystalline silicon resistor. Thus, it is achieved that input diode zones (11) are no longer connected to the substrate voltage.

18 Claims, 7 Drawing Figures

PRIOR ART

CHARGE-COUPLED DEVICE WITH REDUCED SIGNAL DISTORTION

BACKGROUND OF THE INVENTION

The invention relates to a charge-coupled device (CCD) comprising a monocrystalline semiconductor body having a layer-shaped region of the one conductivity type, which adjoins a major surface and is provided with: a charge transport channel for storing and transporting supplied information in the form of charge packets; electrical connection means for applying a voltage $V_{BB}$ to the layer-shaped region; an input circuit comprising a zone (designated as an input diode) of the second conductivity type; and supply means for supplying a signal-dependent voltage to the input diode.

Charge-coupled devices, in which the input signal is supplied as a voltage to the input diode, are generally known. When a suitable voltage is applied to the first storage-electrode (input gate), a potential well is induced in the channel which can be filled with a charge packet. There is arranged between the input diode and the first storage electrode, a sampling gate, by means of which the input diode and the said charge packet can be connected to each other and can be insulated from each other. The size of the charge packet depends upon the potential of the input diode and hence upon the input signal. In general, the zero level, at least with surface CCD's, is chosen so that even with a "0" input signal a certain amount of charge is introduced into the said potential well (fat zero or reference charge). The maximum level depends upon the depth of the potential well. When the charge packet and the input diode are insulated from each other, the charge packet can be transported further, for example, by applying to the next subsequent clock electrode, a sufficiently high voltage, as a result of which there is formed under this clock electrode a deeper potential well which receives the charge packet.

It has been found in practice that with such an input circuit unexpectedly large distortions of the signals frequently occur. These distortions may even be so large that, for example, with digital information, in which event only a "0" level and a "1" level (full bucket) are present, it is difficult to discriminate these levels from each other at the output because the "0" level (empty bucket) has filled substantially completely. These distortions especially occur in charge-coupled devices in which the clock electrodes comprise a transfer part and a storage part, means being internally provided, such as a difference in doping concentration or a difference in oxide thickness, to generate a difference in threshold voltage. Such an electrode configuration occurs, for example, in a two-phase CCD, in which a potential barrier with respect to the storage part should be formed under the transfer part. Due to this asymmetrical configuration, it is achieved, as is well known, that charge transport can take place in only one direction.

SUMMARY OF THE INVENTION

The invention has for its object to provide a charge-coupled device of the kind described in the opening paragraph, in which these distortions of the signals are substantially completely avoided.

A charge-coupled device according to the invention is characterized in that the said supply means comprise a voltage divider having a junction point which is coupled to the input diode and having a first resistance element between the junction point and a reference voltage and a second resistance element between the junction point and $V_{BB}$, which second resistance element comprises an element arranged outside the monocrystalline semiconductor body.

The invention is based inter alia on the recognition of the fact that the leakage ocurrents which cause the signal distortions described here are for the major part due to cross-talk between the semiconductor substrate and the clock electrodes as a result of which the potential of the substrate (or at least of the layer-shaped region of the substrate) at least locally varies with the clock voltages. Due to these voltage variations, pn junctions in the input circuit, more particularly of zones which are brought to the substrate voltage $V_{BB}$ and are themselves less sensitive to clock cross-talk than the substrate, can be periodically biased in the forward direction and can inject charge into the substrate, which charge is added at least in part to the signal charge. By the use of a resistance element, for example a polycrystalline resistor, arranged outside the semiconductor body, it is possible to avoid the presence of zones which are biased at substrate voltage $V_{BB}$ and thus to prevent the signal distortion described.

BRIEF DESCRIPTION OF THE DRAWINGS

The invention will be described more fully with reference to an embodiment and the accompanying diagrammatic drawing, in which.

DETAILED DESCRIPTION OF THE INVENTION

The invention will be explained with reference to an n-channel surface CCD. However, it will be clear to those skilled in the art that the principle of the invention may also be used in p-channel CCD's, in charge transfer devices of the bucket brigade type or in charge-coupled devices of the buried channel type.

Figure 1:
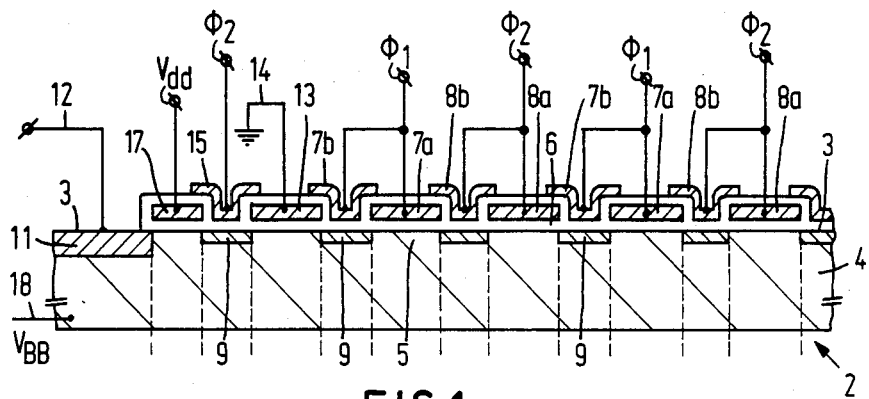
FIG. 1 is a sectional view of a charge-coupled device.

FIG. 1 shows a known two-phase charge-coupled device. The device is provided in a semiconductor body 2 of silicon, of which at least a region 4 adjoining the surface 3 is p-type conducting. Generally, the whole semiconductor body 2 is p-type conducting. In the region 4 the charge transport channel 5 is defined for storing and transporting information in the form of charge packets of electrons. Above the channel 5 there is formed a thin dielectric layer 6, which in this embodiment consists of an approximately 30 nm thick oxide layer, but which of course may also comprise other dielectric materials, such as silicon nitride, or combinations of other materials. There are formed in a double-layer metallization on the oxide layer 6 clock electrodes 7, 8 suitable for two-phase operation, which have a storage part 7a and 8a, respectively, and a transfer part 7b and 8b, respectively. The storage parts 7a, 8a are provided in a first metallization layer, more particularly in a polycrystalline silicon layer. The transfer parts 7b, 8b are made of Al, but may of course also be made of polycrystalline silicon or of another suitable conductive material. The clock electrodes 7, 8 are connected to a clock voltage source, by means of which the clock voltages $\phi_1$ and $\phi_2$, respectively, are applied. In order to define the direction of the charge transport (from the lefthand side to the righthand side), there are provided under the Al parts parts 7b, 8b p-zones 9 having a higher doping than the region 3, which, as is known, ensure that, when the same voltage is applied to the storage parts and to the transfer parts, a potential barrier (for electrons) is induced under the transfer parts and a potential well is induced under the storage parts. Instead of using p-zones 9, this asymmetry may also be obtained by other known techniques, such as, for example, by providing thicker oxide under the transfer parts 7b, 8b.

The input comprises an n-type surface zone 11 (designated hereinafter as input diode), which is provided with an electrical connection 12 for supplying input signals. The charge packets are formed under an input gate 13, to which is applied a direct voltage via the connection 14. The connection between the storage region under the input gate 13 and the input diode 11 can be established or interrupted by means of the gate 15 (sampling gate), to which the clock voltage $\phi_2$ is applied. The input gate electrode 13 and the sampling gate 15 are provided in the layer of polycrystalline silicon and in the layer of Al, respectively. There is formed under the sampling gate 15 a p-zone 9 identical to the zones 9 under the transfer parts 7b, 8b of the clock electrodes 7, 8.

The sampling gate 15 can be provided directly beside the input diode 11. In the present embodiment, however, there is provided between the sampling gate 15 and the input diode 11 an additional gate 17, to which is applied a direct voltage and which offers a number of advantages. In the first place, this gate prevents clock voltages from cross-talking to the input diode. Moreover, this gate which is provided in the polycrystalline silicon layer, has the advantage that the definition of the Al sampling gate 15 is more accurate.

Figure 3:
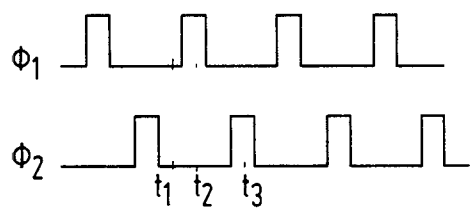
FIG. 3 shows the clock voltages $\phi_1$, $\phi_2$, which are applied to the device shown in FIG. 1, as a function of time t.

During operation, a negative voltage $V_{BB}$ of, for example, $-3.5$ V, is applied to the p-type semiconductor region 3 via the connection 18. The clock electrodes 7, 8 have applied to them the clock voltage $\phi_1$ and $\phi_2$, respectively, which are shown in FIG. 3 as a function of time t and which vary between a high level of, for example, 5 V and a low level of, for example, 0 V (earth). The input gate 13 is connected to earth and the gate 17 is connected to the (positive) supply source $V_{dd}$ so that a conductive channel is always present under the gate 17. The input diode 11 varies, depending upon the information to be supplied, between a low level of, for example, $-2.5$ V (full charge packet) corresponding to a logic "1" and a level of about 0.2 V (fat zero) corresponding to a logic "0".

Figure 2:
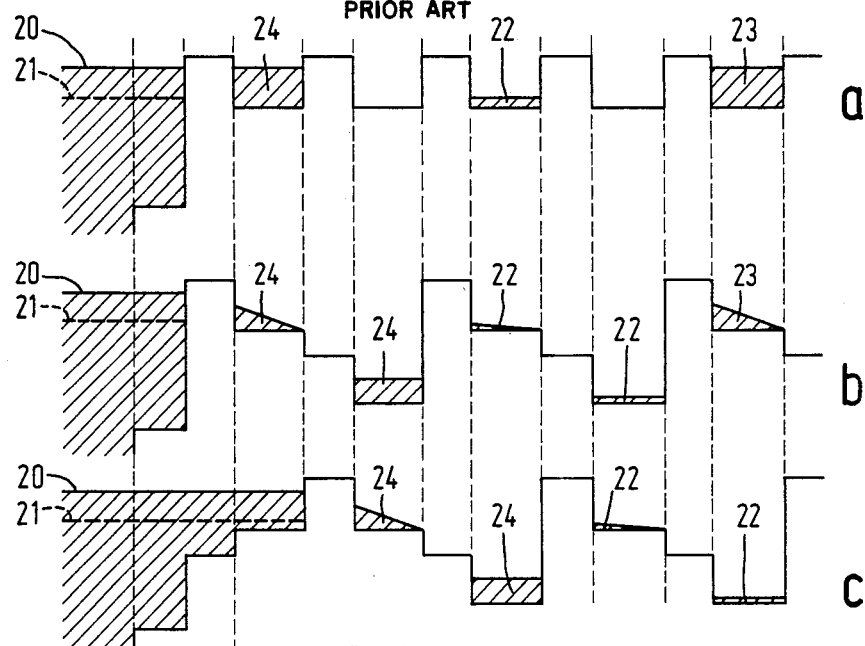
FIG. 2 shows the potential distribution which is induced at two instants during operation in the part shown in FIG. 1 of the device.

In FIGS. 2a, b, c, the potential profiles are represented, which are induced in the part shown in FIG. 1 of the charge-coupled device at the instants $t_1$, $t_2$ and $t_3$, respectively, indicated in FIG. 3. As usual, the positive potential is plotted in downward direction. The level of the potential of the input diode 11 corresponding to a logic "1" is indicated by the line 20. The level corresponding to a "0" is indicated by the broken line 21. FIG. 2a shows the situation in which $\phi_1 = \phi_2 = 0$ V after a $\phi_2$ pulse ($t_1$ in FIG. 3). The information is now stored under the clock electrodes 8. The drawing shows a small packet 22 representing a "0" and a large (full) packet 23 representing a "1". Simultaneously, there is formed under the input gate 13 a packet 24 which corresponds to a "1". The connection between this packet 24 and the input diode 11 is cut off by the potential barrier under the sampling gate 15. At $t_2$ $\phi_1$ is high, as a result of which the charge packets 22-24 are transferred to potential wells under the clock electrode 7a. This is shown in FIG. 2b. FIG. 2c shows the situation in which at the occurrence of a $\phi_2$ pulse ($t_3$ in FIG. 3) the charge packets are transferred to potential wells under the clock electrodes 8a. Simultaneously, the potential barrier under the sampling electrode 15 is eliminated, as a result of which charge can flow again from the input diode into the potential well under the input gate 13.

Figure 4:
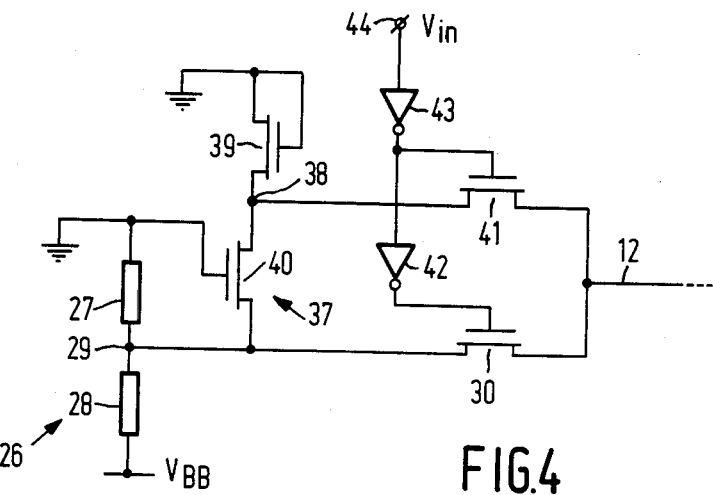
FIG. 4 shows an input circuit for the device shown in FIG. 1 according to the invention.

For a satisfactory charge transport, the clock voltages $\phi_1$, $\phi_2$ must be so large that the potential barriers under the transfer parts 7b, 8b of the receiving clock electrodes are located beneath the potential wells of the storage parts 7a, 8a of the other clock electrodes, which are at the low level. Due to the large amplitudes of the clock pulses, the potential of the surface region 4 can also vary with the clock voltages $\phi_1$ and $\phi_2$ by capacitive cross-talk. FIG. 4 shows the circuit diagram of an input circuit according to the invention, which is so constructed as to prevent pn junctions being biased (due to the said cross-talk) in the forward direction and thus leading to signal distortion. The circuit comprises for this purpose a voltage divider 26 comprising two resistance elements 27 and 28 between a reference voltage (earth) and a junction point 29 on the one hand and between the junction 29 and a point at the substrate voltage $V_{BB}$ on the other hand. The input diode 11 is connected to the conductor 12 and through a switch 30 to the junction 29. According to the invention, the element 28, which is connected to $V_{BB}$, is constituted by an element which is arranged outside the substrate 2. Due to the fact that the element 28, which is connected to the lowest potential of all circuit elements of the input circuit, is arranged outside the substrate 2 (surface region 4) and therefore does not form a pn junction with the substrate, potential fluctuations in the substrate will not or at least substantially not influence the element 28. Due to the fact that furthermore the remaining circuit elements or parts thereof are applied to a higher potential, pn junctions formed by these elements (or parts thereof) with the substrate will always remain cut off even when potential fluctuations occur in the substrate owing to clock cross-talk.

Figure 6:
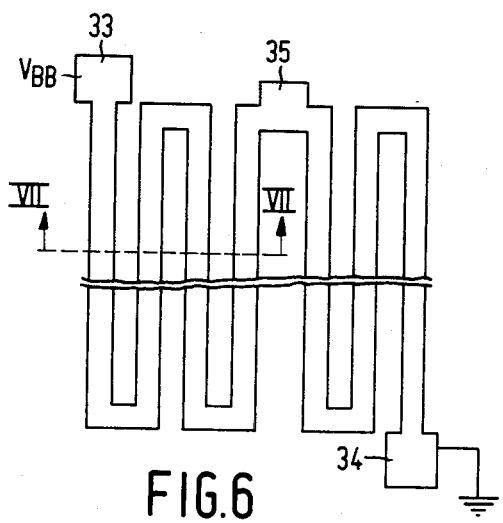
FIG. 6 is a plan view of a voltage divider used in FIG. 4.
Figure 7:
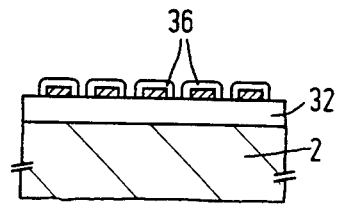
FIG. 7 is a sectional view of this voltage divider taken on the line VII—VII in FIG. 6.

In practical embodiments, the voltage divider, or at least the element 28, can be constituted by elements or an element arranged outside the envelope in which the charge-coupled device is usually provided. In the present embodiment, however, the resistance element 28 is arranged on top of the semiconductor body 2, more particularly as a resistor of polycrystalline silicon material. The resistance element 27 may comprise, if desired, a conventional MOS transistor, which is formed in the body 2. However, in the embodiment to be described here, the element 27 is also constituted by a resistor of polycrystalline silicon. FIGS. 6 and 7 show a plan view and a cross-section, respectively, of the voltage divider 26. The resistor is provided on the comparatively thick oxide layer 32, which covers the parts of the surface 4 lying outside the active parts. The resistors 27, 28 can be made of the the same polycrystalline silicon layer as the clock electrodes 7a, 8a. The sheet resistance of this layer is about 30Ω. In order to obtain a sufficiently high resistance value within a reasonable surface area, the resistor is folded, as a result of which a meander-shaped structure is formed having an overall resistance lying between 10 and 15 kΩ. The meander structure comprises three connections, i.e. the connections 33 and 34 at the ends which are connected to $V_{BB}$ and earth, respectively, and the connection 35 which corresponds to the junction 29 in FIG. 4. The area of connection 29 can be accurately determined from the ratio of the resistors 27 and 28. The poly material can be coated, after the definition of the meander structure, with thermal oxide 36 whilst simultaneously applying the oxide to the poly electrodes 7a and 8a. Contact holes can be provided in this oxide layer at the area of the connection surfaces 33–35, after which in known manner Al contacts and Al conductor tracks can be formed.

The reference level for the "0" signal (fat zero) is generated by the voltage divider 37, the reference voltage being derived from the junction point 38 between the two resistance elements. The voltage divider 37, which is connected between earth and the junction 29 may have a construction similar to that of the voltage divider 26. In the present embodiment, however, the voltage divider 37 comprises a third resistance element 39 and a fourth resistance element 40 in the form of field effect transistors, the transistor 39 being connected between earth and the junction 38 and the transistor 40 being connected between the junction 38 and the junction 29. The gate electrodes of the transistors 39 and 40 are connected to earth. The potential at point 38, for example −0.2 V, can be adjusted in a simple manner by those skilled in the art by means of the geometric ratio of the transistors 39 and 40.

Figure 5:
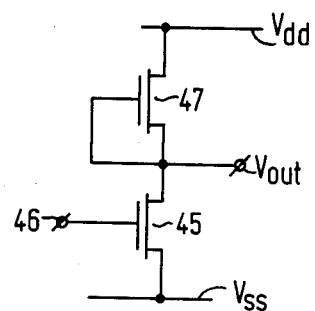
FIG. 5 shows the circuit diagram of an inverter stage shown diagrammatically in FIG. 4.

The junction 38 is connected through a switch comprising a MOS transistor 41 and through the connection (conductor) 12 to the input diode 11. The gates of the MOS transistors 30 and 41 are connected to the outputs of two series-connected inverter circuits 42 and 43, respectively. The information $V_{in}$ is supplied via the input terminal 44 of the inverter circuit 43. When $V_{in}=1$ (high), the output signal of the inverter circuit 43 is low, as a result of which the transistor 41 is non-conducting. The output signal of the inverter circuit 42 is high again so that the transistor 30 is conducting and the input diode 11 is connected through conductors 12 to the point 29. Conversely, with $V_{in}=0$ (low), the transistor 41 is conducting and the transistor 30 is non-conducting, as a result of which the input diode 11 is connected to the point 38. The inverter circuits 42, 43 may have a known construction as shown in FIG. 5. The circuit arrangement comprises an inverter transistor 45, whose source zone is connected to $V_{SS}$ (earth). The input signals are supplied via the terminal 46 to the gate electrode of the transistor 45. The drain of the transistor 45 is connected to the source of a load transistor 47. The gate electrode of this transistor—which is of the depletion type—is connected to its source. The drain of the transistor 47 is connected to the positive supply source $V_{dd}$. The output signal of the inverter circuit can be derived at the terminal $V_{out}$.

It should be noted that the lowest potential occurring in the inverter circuits 42, 43 is the earth potential $V_{SS}$. Since this potential is considerably higher than $V_{BB}$, there will be no or substantially no risk also in the inverter circuits 42, 43 that pn junctions in the inverter circuits will be connected in the forward direction due to clock cross-talk between the substrate and the clock electrodes.

It will be appreciated that the invention is not limited to the embodiment described, but that many further modifications are possible for those skilled in the art without departing from the scope of the invention. For example, the invention may advantageously be used in other types of charge-coupled devices than described herein, such as, for example, in 1 bit/electrode charge-coupled devices, in which in a group of m successive electrodes (m−1) bits are stored and in which the transport takes place by displacing the empty bucket in the direction opposite to the charge transport direction. Furthermore, the resistance element 28 may alternatively be constituted by a circuit element other than a resistor, for example a MOS transistor formed in the polycrystalline silicon layer.

We claim:

1. A charge-coupled device comprising a monocrystalline semiconductor body having a layer-shaped region of the one conductivity type which adjoins a major surface and is provided with: a charge transport channel for storing and transporting supplied information in the form of charge packets; electrical connection means for applying a voltage $V_{BB}$ to the layer-shaped region; an input circuit comprising a zone (designated as an input diode) of the second conductivity type, and supply means for supplying a signal-dependent voltage to the input diode, characterized in that the said supply means comprise a voltage divider having a junction point which is coupled to the input diode and a first resistance element connected between the junction point and a reference voltage and a second resistance element connected between the junction point and $V_{BB}$, which second resistance element comprises an element arranged outside the monocrystalline semiconductor body, and the second resistance element comprises a resistance layer which is applied to an insulating layer covering the surface of the semiconductor body.

2. A charge-coupled device as claimed in claim 1, characterized in that there is present above the charge transport channel a row of clock electrodes, which, viewed in the charge transport direction, each comprise a transfer part and a storage part arranged consecutively, internal means being provided by means of which, when the same voltage is applied to both parts, a potential barrier for the charge carriers to be transported is induced under the transfer part and a potential well is induced under the storage part.

3. A charge-coupled device as claimed in claim 2, characterized in that the first resistance element is also formed by a resistance layer deposited on the insulating layer.

4. A charge-coupled device as claimed in claim 3, characterized in that the resistance layer comprises a layer of polycrystalline silicon.

5. A charge-coupled device as claimed in claim 2, characterized in that the resistance layer comprises a layer of polycrystalline silicon.

6. A charge-coupled device as claimed in claim 2, characterized in that the reference voltage is a voltage $V_{SS}$, for example earth potential, for which it holds that $|V_{SS}| < |V_{BB}|$.

7. A charge-coupled device as claimed in claim 2, characterized in that there is connected between the said reference voltage and the said junction point (designated hereinafter as the first junction point) of the said voltage divider (designated hereinafter as the first voltage divider) a second voltage divider comprising a third resistance element connected between the reference voltage and a second junction point and a fourth resistance element connected between the second junction point and the first junction point, and in that switching means are present, by means of which the input diode is connected, depending upon the input signal, to the first or the second junction point.

8. A charge-coupled device as claimed in claim 7, characterized in that the said switching means comprise two insulated gate field effect transistors, one of which is connected between the first junction point and the input diode and the other of which is connected between the second junction point and the input diode, and in that further means are provided, by means of which the input signal can be supplied to the gate electrode of one field effect transistor and the inverted input signal can be supplied to the gate electrode of the other field effect transistor.

9. A charge-coupled device as claimed in claim 7, characterized in that the third and the fourth resistance elements each comprise an insulated gate field effect transistor.

10. A charge-coupled device as claimed in claim 9, characterized in that the said switching means comprise two insulated gate field effect transistors, one of which is connected between the first junction point and the input diode and the other of which is connected between the second junction point and the input diode, and in that further means are provided, by means of which the input signal can be supplied to the gate electrode of one field effect transistor and the inverted input signal can be supplied to the gate electrode of the other field effect transistor.

11. A charge-coupled device as claimed in claim 1, characterized in that the first resistance element is also formed by a resistance layer deposited on the insulating layer.

12. A charge-coupled device as claimed in claim 11, characterized in that the resistance layer comprises a layer of polycrystalline silicon.

13. A charge-coupled device as claimed in claim 1, characterized in that the resistance layer comprises a layer of polycrystalline silicon.

14. A charge-coupled device as claimed in claim 1, characterized in that the reference voltage is a voltage $V_{SS}$, for example earth potential, for which it holds that $|V_{SS}| < |V_{BB}|$.

15. A charge-coupled device as claimed in claim 1, characterized in that there is connected between the said reference voltage and the said junction point (designated hereinafter as the first junction point) of the said voltage divider (designated hereinafter as the first voltage divider) a second voltage divider comprising a third resistance element connected brtween the reference voltage and a second junction point and a fourth resistance element connected between the second junction point and the first junction point, and in that switching means are present, by means of which the input diode is connected, depending upon the input signal, to the first or the second junction point.

16. A charge-coupled device as claimed in claim 15, characterized in that the said switching means comprise two insulated gate field effect transistors, one of which is connected between the first junction point and the input diode and the other of which is connected between the second junction point and the input diode, and in that further means are provided, by means of which the input signal can be supplied to the gate electrode of one field effect transistor and the inverted input signal can be supplied to the gate electrode of the other field effect transistor.

17. A charge-coupled device as claimed in claim 15, characterized in that the third and the fourth resistance elements each comprise an insulated gate field effect transistor.

18. A charge-coupled device as claimed in claim 17, characterized in that the said switching means comprise two insulated gate field effect transistors, one of which is connected between the first junction point and the input diode and the other of which is connected between the second junction point and the input diode, and in that further means are provided, by means of which the input signal can be supplied to the gate electrode of one field effect transistor and the inverted input signal can be supplied to the gate electrode of the other field effect transistor.

* * * * *